United States Patent
Cooper et al.

(10) Patent No.: US 7,168,018 B2
(45) Date of Patent: *Jan. 23, 2007

(54) APPARATUS AND METHOD FOR REDUCING TEST RESOURCES IN TESTING DRAMS

(75) Inventors: Chris Cooper, Biose, ID (US); Siang Tian Giam, Singapore (SG); Jerry D. McBride, Boise, ID (US); Scott N. Gatzemeier, Boise, ID (US); Scott L. Ayres, Meridian, ID (US); David R. Brown, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 297 days.

This patent is subject to a terminal disclaimer.

(21) Appl. No.: 10/853,573

(22) Filed: May 25, 2004

(65) Prior Publication Data

US 2004/0255211 A1    Dec. 16, 2004

Related U.S. Application Data

(63) Continuation of application No. 09/653,112, filed on Aug. 31, 2000, now Pat. No. 6,854,079, which is a continuation-in-part of application No. 09/454,808, filed on Dec. 3, 1999, now Pat. No. 6,530,045.

(51) Int. Cl.
*G11C 29/00* (2006.01)
(52) U.S. Cl. .................. 714/719; 714/819; 365/201
(58) Field of Classification Search ............... 365/203, 365/194, 230.03, 201; 711/165; 714/718, 714/721, 719, 819
See application file for complete search history.

(56) References Cited

U.S. PATENT DOCUMENTS

| | | | |
|---|---|---|---|
| 5,126,973 A | 6/1992 | Gallia et al. | |
| 5,404,327 A * | 4/1995 | Houston | 365/203 |
| 5,511,029 A | 4/1996 | Sawada et al. | |
| 5,844,849 A * | 12/1998 | Furutani | 365/194 |
| 5,959,929 A | 9/1999 | Cowles et al. | |
| 5,978,300 A * | 11/1999 | Toda | 365/230.03 |
| 6,101,139 A | 8/2000 | Dean | |
| 6,144,598 A | 11/2000 | Cooper et al. | |
| 6,285,962 B1 | 9/2001 | Hunter | |
| 6,314,036 B1 | 11/2001 | Cooper et al. | |
| 6,339,817 B1 * | 1/2002 | Maesako et al. | 711/165 |
| 6,377,501 B1 * | 4/2002 | Maesako et al. | 365/230.03 |
| 6,530,045 B1 | 3/2003 | Cooper et al. | |

OTHER PUBLICATIONS

Rambus® Component Catalog, Copyright Mar. 1999 Rambus Inc, DL-0070-00, (26 pages).

(Continued)

*Primary Examiner*—David Ton
(74) *Attorney, Agent, or Firm*—Knobbe, Martens, Olson & Bear, LLP

(57) ABSTRACT

An apparatus and a method are disclosed for reducing the pin driver count required for testing computer memory devices, specifically Rambus DRAM, while a die is on a semiconductor wafer. By reducing the pin count, more DRAMs can be tested at the same time, thereby reducing test cost and time. One preferred embodiment utilizes a trailing edge of a precharge clock to select a new active bank address, so that the address line required to select a new active address does not have to be accessed at the same time as the row lines.

48 Claims, 13 Drawing Sheets

OTHER PUBLICATIONS

Rambus® Technology Overview, Copyright Feb. 1999 Ramubs Inc, DL-0040-00, (27 pages).

Rambus® Preliminary Information, Direct RDRAM 128/144-Mbit (256K×16/18×32s), Document DL0059, Version 0.9 (62 pages).

* cited by examiner

APPARATUS AND METHOD FOR REDUCING TEST RESOURCES IN TESTING DRAMS

RELATED APPLICATIONS

This present application is a continuation of U.S. patent application Ser. No. 09/653,112, filed Aug. 31, 2000, now U.S. Pat. No. 6,854,079, issued Feb. 8, 2005, which is a continuation-in-part application of U.S. patent application Ser. No. 09/454,808, filed on Dec. 3, 1999, now U.S. Pat. No. 6,530,045, issued on Mar. 4, 2003.

BACKGROUND OF THE INVENTION

1. Field of the Invention

This invention relates generally to semiconductor wafer testing and more particularly to an apparatus and method for reducing the pin count necessary to test Rambus dynamic random access memory (RDRAM).

2. Description of the Related Art

Rambus DRAM (RDRAM) is a general-purpose, high-performance, packet-oriented dynamic random-access memory (DRAM) device suitable for use in a broad range of applications, including computer memory, graphics, video, and other applications. FIG. 1 schematically illustrates an RDRAM device 10 interconnected with a central processing unit (CPU) 11 as part of a typical computer system. The RDRAM device 10 receives clock signals 12, control logic signal 14 and address information 16 from the CPU 11 via a controller 20. Data 17 is written to and read from the RDRAM 10.

FIG. 2 is a block diagram illustrating one 144 Mbit RDRAM configuration in the normal mode. The RDRAM comprises two major blocks: a "core" block 18 comprising banks 22, sense amps 24 and I/O gating 26 similar to those found in other types of DRAM devices, and a control logic block in normal mode 19 which permits an external controller 20 to access the core 18. The RDRAM core 18 is internally configured as 32 banks 22. Each bank 22 has 32,768 144-bit storage locations.

FIG. 3 is a diagram indicating that each of the banks 22 is organized as 512 rows 28 by 64 columns 30 by 144 bits 32. The 144 bits 32 in each column 30 are serially multiplexed onto the RDRAM's I/O pins as eight 18-bit words 34. The most significant bits 17-9 are communicated on I/O pins DQA <8:0>, and the least significant bits 8-0 are communicated on the I/O pins DQB <8:0>. The nine bits on each set of pins are output or input on successive clock edges so that the bits in the eight words are transferred on eight clock edges.

The control logic block 19 in FIG. 2 receives the CMD, SCK, SIO0, and SIO1 strobes that supply the RDRAM configuration information to the controller 10, and that select the operating modes of the RDRAM device 10. The CFM, CFMN, CTM and CTMN pins generate the internal clocks used to transmit read data, receive write data, and receive the row and column pins used to manage the transfer of data between the banks 22 and the sense amps 24 of the RDRAM 10.

Address information 16 is passed to the RDRAM device 10 from the CPU 11 via eight RQ pins 36 as illustrated in FIG. 4. The RQ pins 36 are divided into two groups. Three ROW pins 38 are de-multiplexed into row packets 40 that manage the transfer of data between the banks 22 and the sense amps 24. Five COL pins 42 are de-multiplexed into column packets 44 and manage the transfer of data between the data pins and the sense amps 24 of the RDRAM 10. More detailed information on the operation of RDRAM can be found in Reference A, Direct RDRAM Preliminary Information, Document DL0059 Version 0.9 by Rambus Inc. which is incorporated herein by reference.

Semiconductor chips, such as an RDRAM device 10, contain circuit elements formed in the semiconductor layers which make up the integrated circuits. FIGS. 5A and 5B illustrate a semiconductor chip with exposed bonding pads 46 made of metal, such as aluminum or the like that are formed as terminals of integrated circuits. In normal operation, the control signals 14, the address signals 16, and the data 17 are exchanged with the CPU 11 through connections at these bonding pads 46.

In the manufacturing process, a large number of semiconductor chips, each having a predetermined circuit pattern, are formed on a semiconductor wafer 48 such as that shown in FIG. 6. FIG. 6 illustrates the semiconductor wafer 48 prior to being diced into individual semiconductor chips. Although FIG. 6 only shows a relatively small number of semiconductor chips on the wafer, one skilled in the art will appreciate that many semiconductor chips can be cut from a single wafer. The semiconductor chips 10 are subjected to electrical characteristic tests while they are on the wafer 48 through the use of a testing apparatus, e.g., a wafer probe 50 having a plurality of pins 52. Note that only the head of the wafer probe 50 is shown in FIG. 6. Wafer probe testing is commonly used to quality sort individual semiconductor chips before they are diced from the wafer 48. The primary goal of wafer probe testing is to identify and mark for easy discrimination defective chips early in the manufacturing process. Wafer testing significantly improves manufacturing efficiency and product quality by detecting defects at the earliest possible stages in the manufacturing and assembly process. In some circumstances, wafer probe testing provides information to enable certain defects to be corrected.

FIG. 7 shows a plurality of the conductive pins 52 of the wafer probe 50 of FIG. 6. The pins have respective tip ends 54 positionally adjusted to align with the bonding pads 48 of the RDRAM device 10 to be tested. A wafer probe 50 has a limited number of pins 52 (e.g., 100 pins) available to supply the test signals to the RDRAM device 10 in the wafer 48. The RDRAM devices 10 could be tested in their normal mode, but this would require in excess of 40 pins 52 on the wafer probe 50 to test each chip 10. Others have recognized the benefits of creating a special test mode that enables a semiconductor chip such as an RDRAM device 10 to be tested with fewer pins. Therefore, one skilled in the art will recognize that it is not required to have a pin 52 for every bonding pad 48 on the chip 10. However, prior testing methodology for RDRAM devices 10 requires at least 34 pins 52 on the wafer probe 50 to test each RDRAM device 10. Consequently, the 100 pin wafer probe is restricted to test, at most, two semiconductor chips at one time. As a result, the production time and chip costs are negatively impacted by this limitation.

As set forth above, the prior art method of wafer testing RDRAM chips requires 34 pins 52 to test each RDRAM device 10, of which 18 pins are address and data pins. Following this method, the first operation in selecting the address on the RDRAM core entails precharging the bank 22. Precharging is necessary because adjacent banks 22 share the same sense amps 24 and cannot, therefore be simultaneously activated. Precharging a particular bank 22 deactivates the particular bank and prepares that bank 22 and the sense amps 24 for subsequent activation. For example, when the row 28 in the particular bank 22 is activated, the two adjacent sense amps 24 are connected to or associated with that bank 22, and therefore are not available for use by the two adjacent banks. Precharging the bank 22 also automatically causes the two adjacent banks to be precharged, thereby ensuring that adjacent banks are not activated at the same time.

Selecting one of the 32 banks 22 to precharge requires five address bits to specify the bank address. These address bits are provided in a first control signal. The next operation in selecting an address is activating a row 28 in a selected bank using a second control signal. This operation requires nine address bits to select one of the 512 rows 28, and five address bits to select one of the 32 banks 22, for a total of 14 address bits. The next operation reads a column 30 in an open bank using a third control signal. This operation requires five bank bits. This operation also requires six column bits to select one of the 64 columns 30.

Reducing the number of address bits required to specify the address location to be tested reduces the number of pin connections 52 required on the wafer probe 50 to test each individual RDRAM device 10. Reducing the required number of pin connections 52 therefore allows more devices 10 to be tested at the same time, thus permitting an important reduction in production time and chip costs. As chip sizes continue to decrease, there is a corresponding increase in the number of chips on each semiconductor wafer to be tested. Therefore, the ability to test an increased number of devices at the same time grows in importance.

SUMMARY OF THE INVENTION

The invention comprises a method of testing computer memory devices, such as Rambus DRAM. The method requires fewer pin connections to test each chip on a semiconductor wafer than previously known methods. The test is performed on a semiconductor wafer using a wafer probe. The number of pins required is reduced by using a trailing edge of a precharge clock to latch the bank address, thus eliminating the need to perform this function on a later step. In combination with such use of the precharge clock's trailing edge, the number of pins required is further reduced by dividing the chip to be tested into a plurality of array cores and compressing the output data so that only one data pin per array core is required. By reducing the pin count, more DRAMs can be tested at the same time, thus reducing the overall test cost and time for testing a complete wafer.

DETAILED DESCRIPTION OF THE PREFERRED EMBODIMENT

Figure 8:
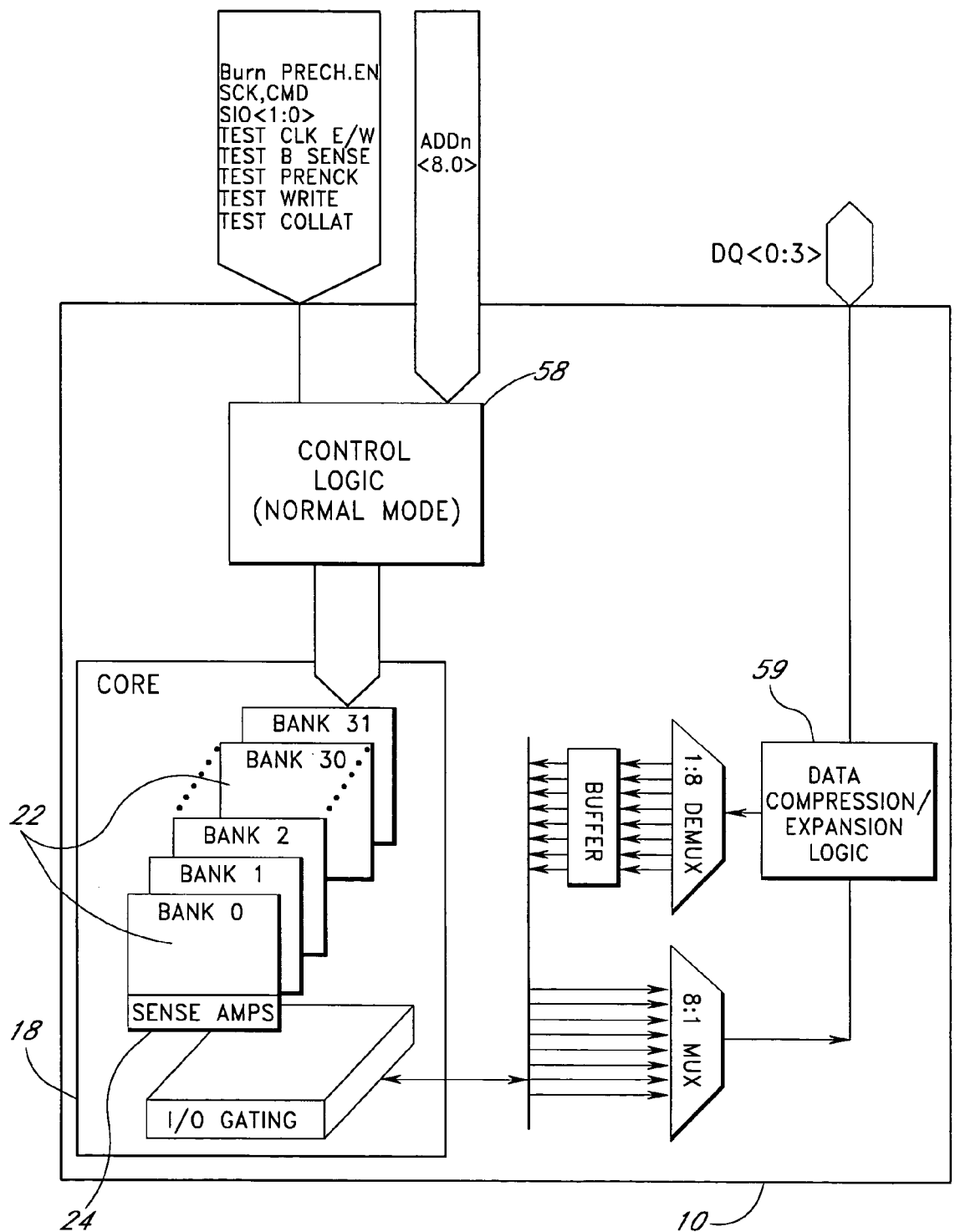
FIG. 8 is a functional block diagram illustrating the RDRAM chip configuration in the DFT mode.

The RDRAM in accordance with the invention has two modes of operation: (1) a high speed packet mode for normal operation; and (2) a low speed asynchronous mode for testing; which bypasses the packetizing hardware, often called "design for test" circuits or DFT. This second mode, shown as a block diagram in FIG. 8 is realized by including DFT mode control logic 58 and data compression logic 59 in the RDRAM device 10 to facilitate testing. In one embodiment of the invention, in the DFT test mode, the RDRAM behaves similar to an asynchronous DRAM, although data is still input/output in bursts of eight.

Figure 9A:
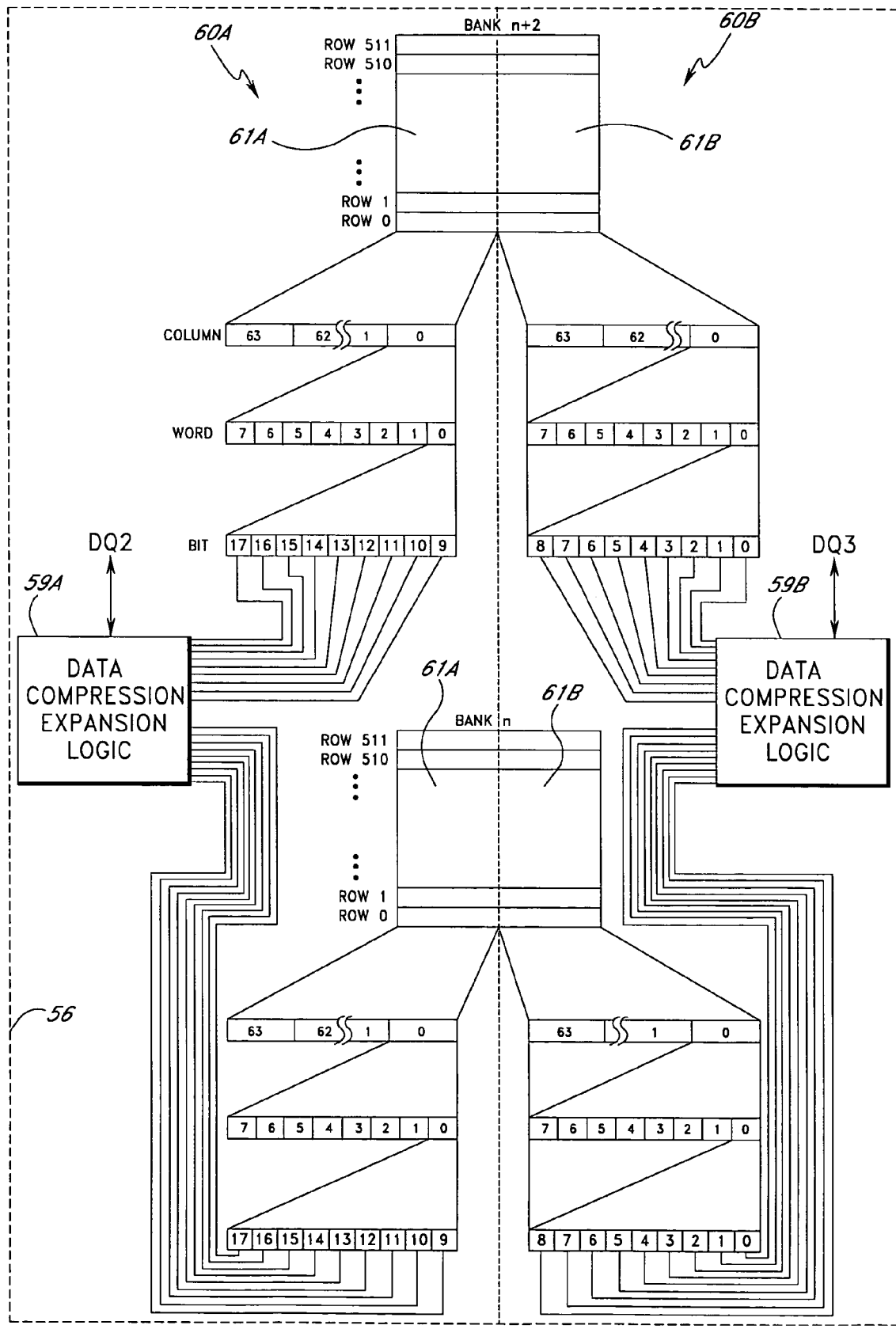
FIGS. 9A and 9B are conceptual drawings, illustrating the RDRAM bank configured in rows, columns, words, and bits and being further divided so that the data from two rows can be compressed for 2X row compression and output compressed into a single DQ for DQ compression.
Figure 9B:
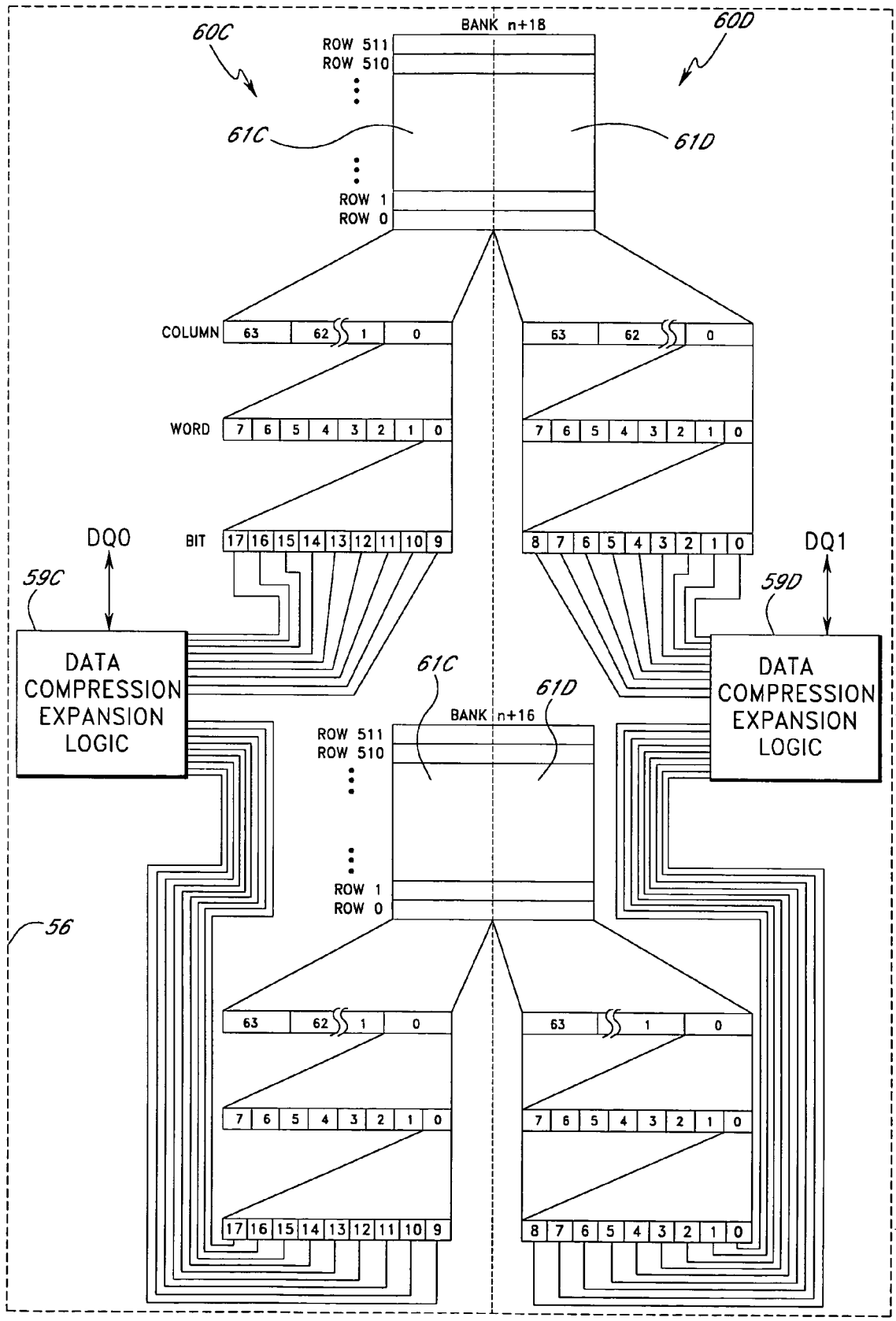

As shown in FIG. 8, the RDRAM comprises three major blocks: a "core" block 18, the control logic block in DFT mode 58 and the Data Compression/Expansion Logic box 59. As shown in FIGS. 9A and 9B, the core 18 is internally configured as 32 banks 22 organized as 512 rows 28 by 64 columns 30 by 144-bit storage locations. The 144 bits are multiplexed as eight 18-bit words. The core is further divided for testing purposes as will be discussed below.

The DFT control logic 58 receives a number of signals from the wafer probe 50, including, TestBSENSE, TestPRECH, TestWRITE, TestCOLLAT, TestCLK_R/W, SIO0, SIO1, CMD, SCK and Burn PRECH_EN. The Data Compression/Expansion Logic 59 compresses data so that only four data pins are required, as will be discussed below.

The pins required for the DFT mode of operation are a subset of the pins used in the normal mode of operation. Many of the functions of the normal mode pins are redefined (as discussed below) for the DFT mode. The mapping of the normal mode pins to the DFT mode functions is illustrated below in Table 1.

TABLE 1

| DFT Pin Mapping | |
| --- | --- |
| Pin | DFT Function |
| SCK | SCK |
| CMD | CMD |
| SIO<1:0> | SIO<1:0> |
| CFM/CTM | TestClkR/W |
| RQ<0> | TestBSENSE |
| RQ<1> | TestPRECH |
| RQ<2> | TestWrite |
| RQ<3> | TestCOLLAT |
| DQB<2:0> | ADR<2:0> |
| DQA<3:0> | ADR<6:3> |

TABLE 1-continued

DFT Pin Mapping

| Pin | DFT Function |
|---|---|
| DQB<3> | ADR<7> |
| DQB<6> | ADR<8> |
| DQB<8> | Burn PRECH_EN |
| DQA<5:4> | DQ<1:0> |
| DQB<5:4> | DQ<3:2> |
| CFMN/CTMN | VCC/2 |
| VCMOS | VCMOS |

Figure 1:
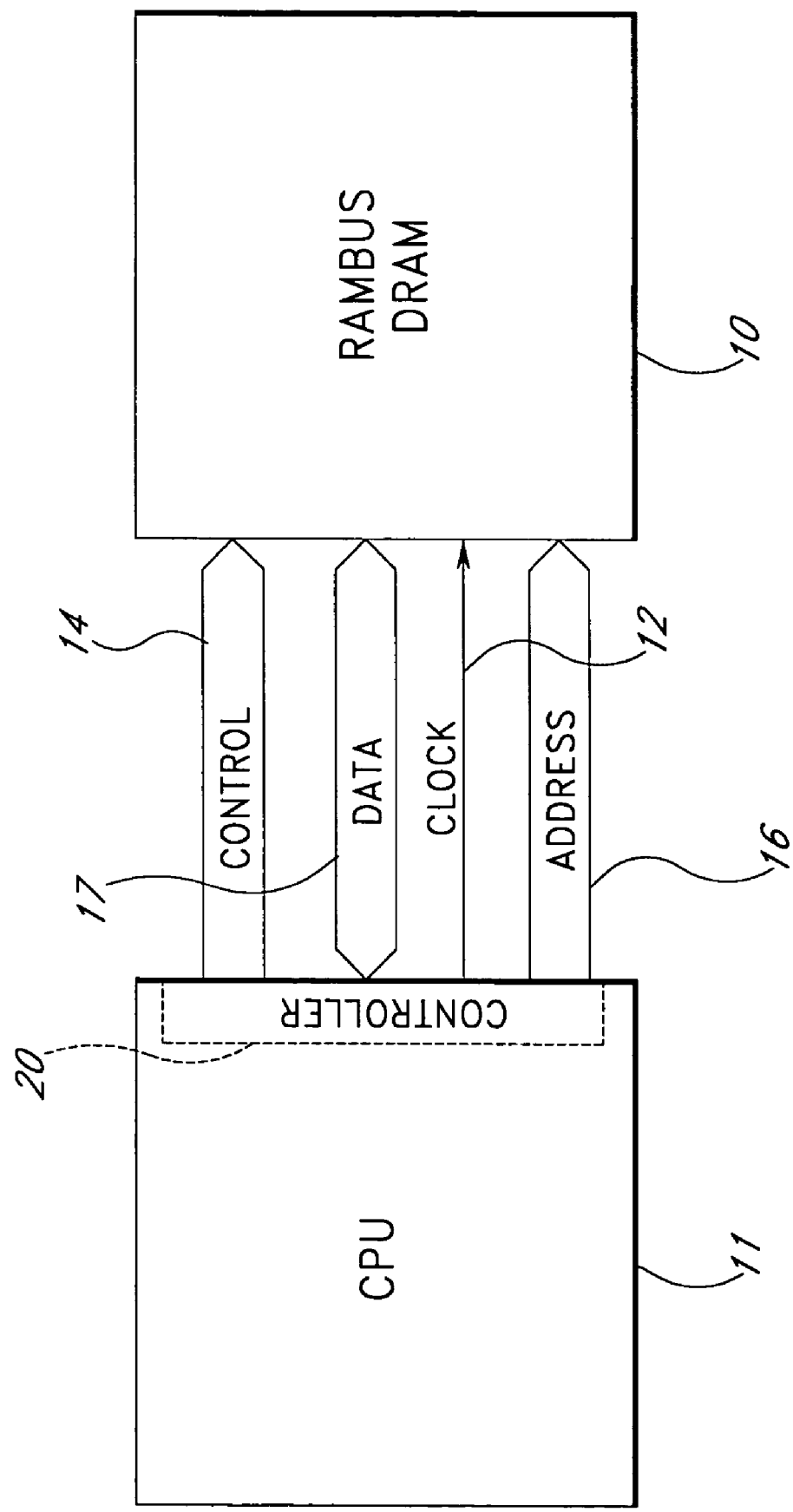
FIG. 1 is a block diagram illustrating a RDRAM device as part of a computer system.
Figure 2:
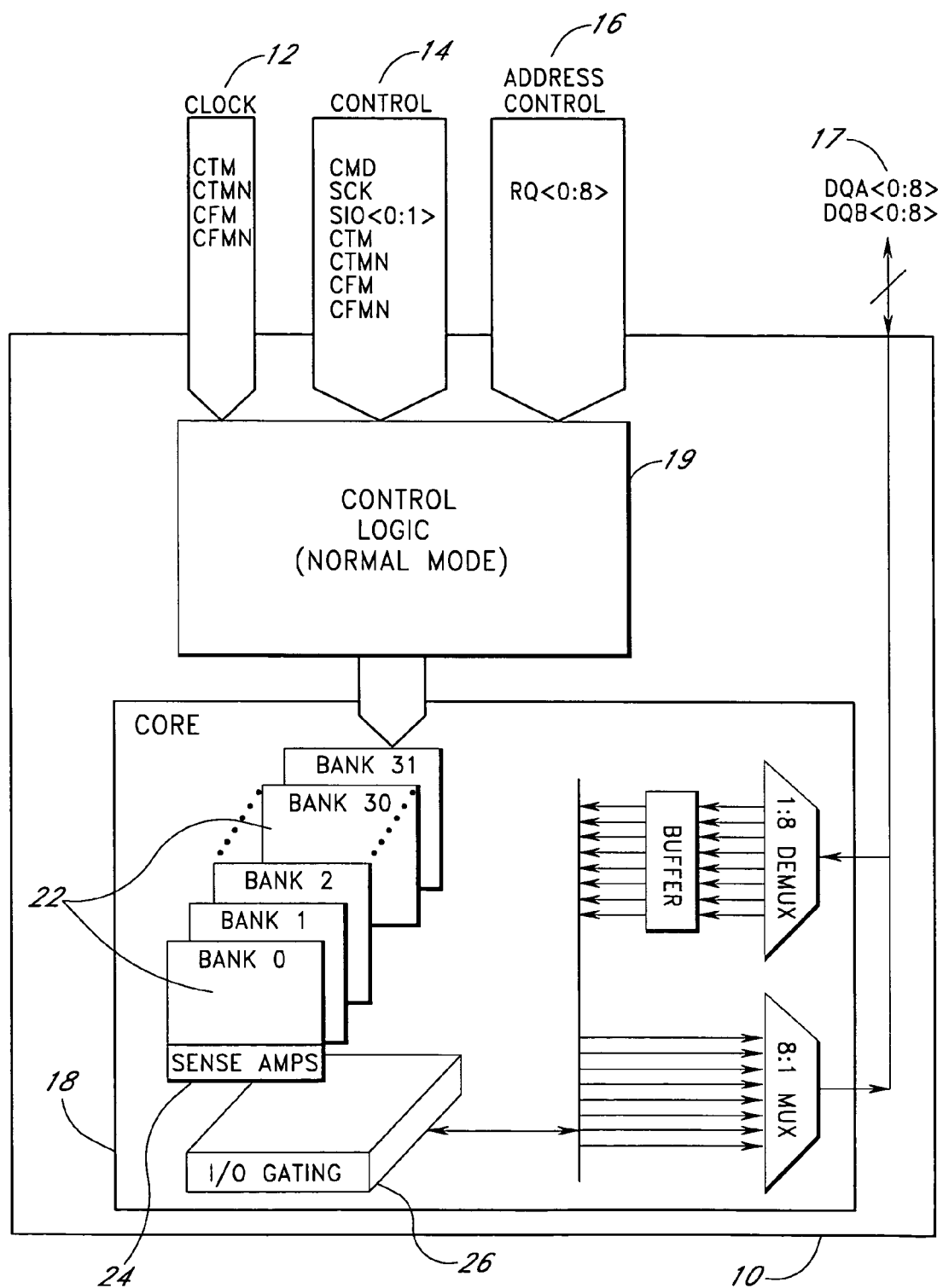
FIG. 2 is a functional block diagram illustrating the RDRAM chip configuration in the normal mode.
Figure 3:
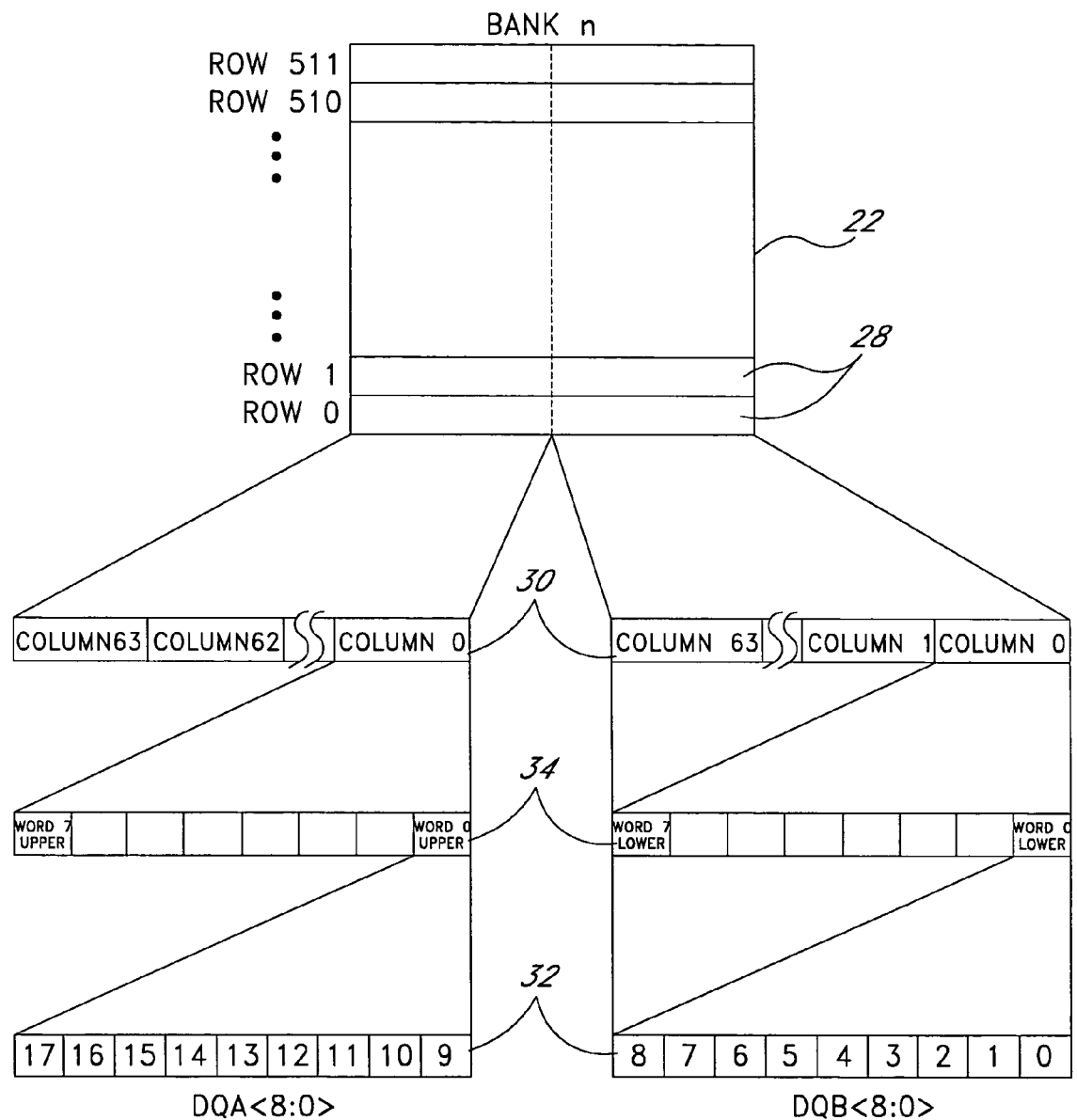
FIG. 3 is a conceptual drawing illustrating the RDRAM bank configured in rows, columns, words, and bits in the normal mode.
Figure 4:
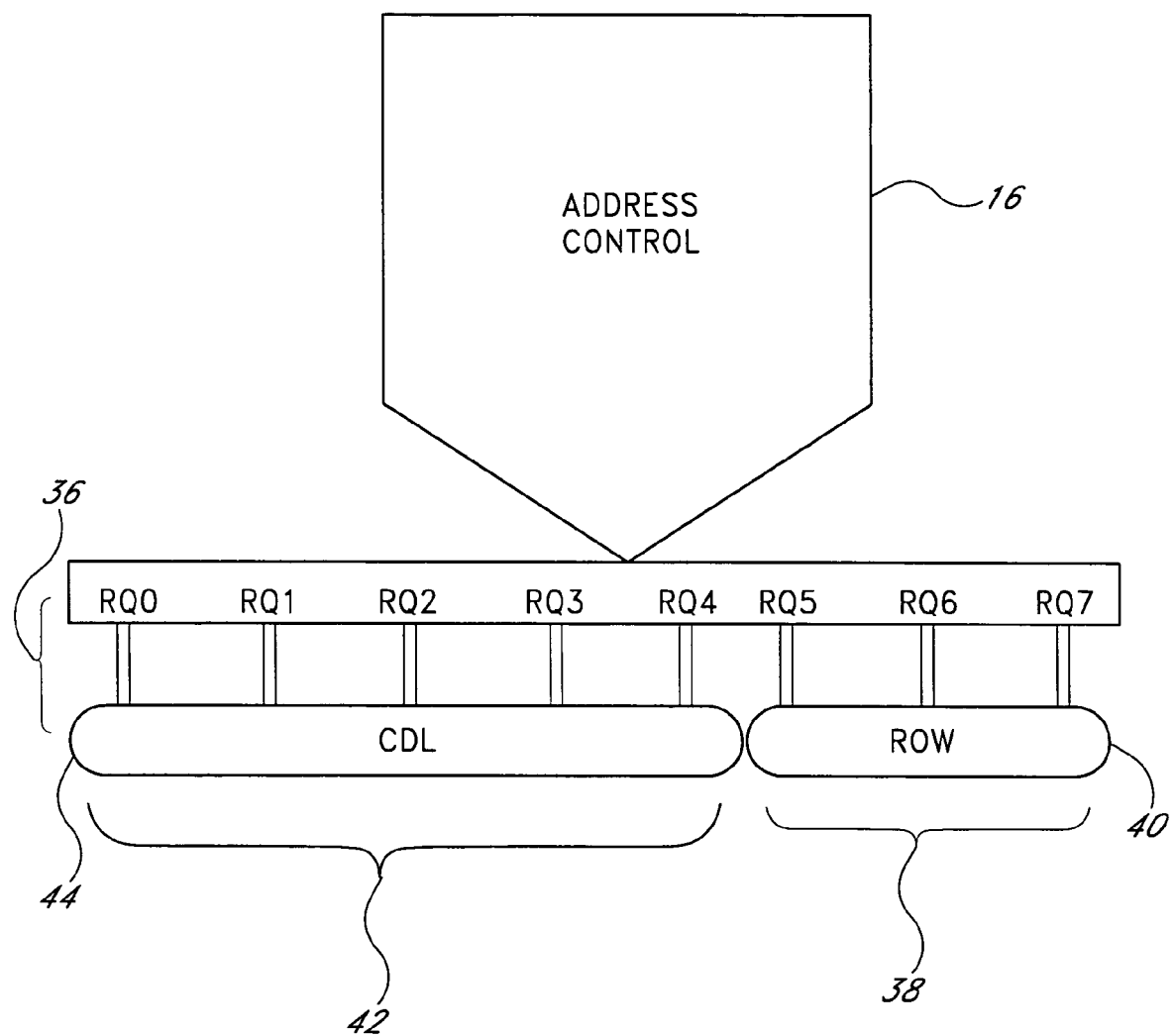
FIG. 4 is a conceptual drawing illustrating RQ pins delivering the address information of FIGS. 1 and 2.
Figure 5A:
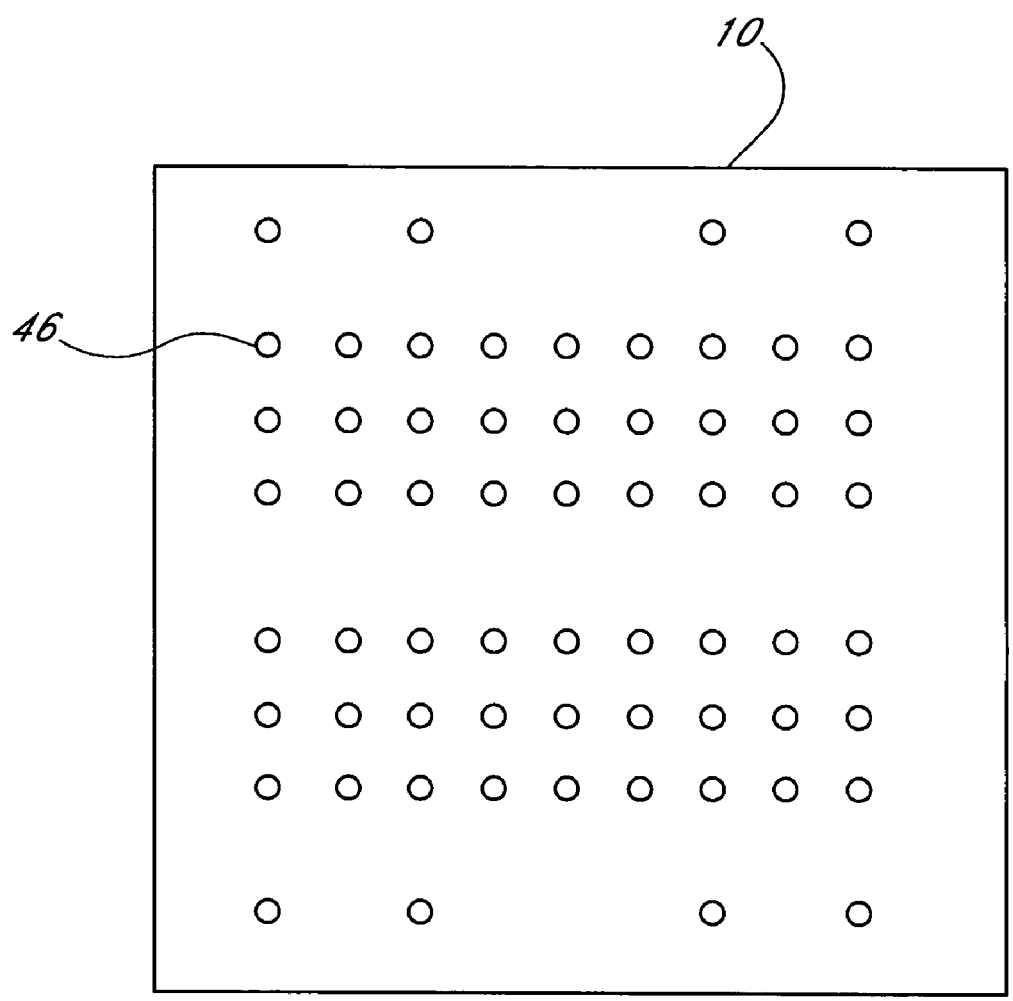
FIG. 5A is a top plan view of a RDRAM chip illustrating the bonding pads.
Figure 5B:
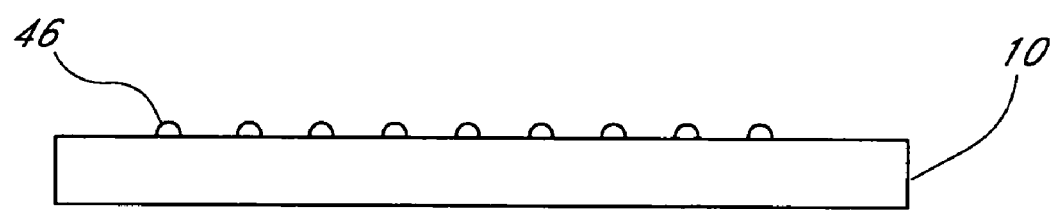
FIG. 5B is a side elevation of the RDRAM of FIG. 5A.
Figure 6:
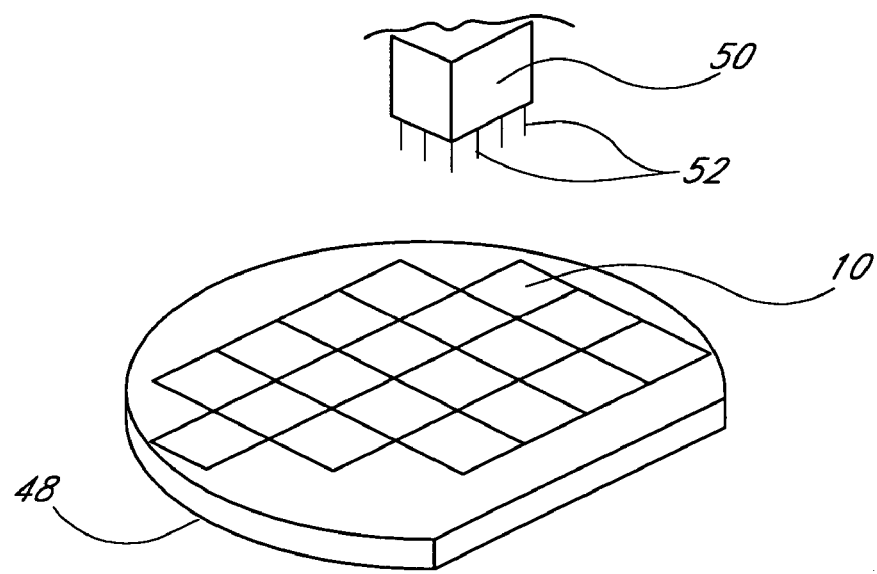
FIG. 6 is a perspective view of a RDRAM semiconductor wafer comprising a plurality of chips with a wafer probe.
Figure 7:
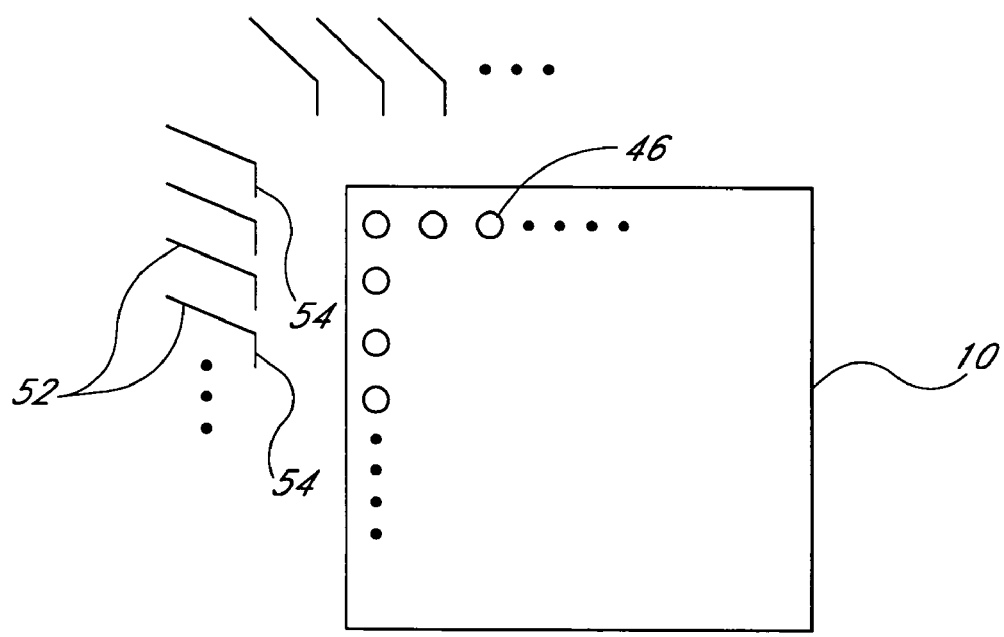
FIG. 7 is a top plan view of the bonding pads of a RDRAM chip aligned with the conductive pins which are connected to a wafer probe.

To test a specific location in the core block 18 of the RDRAM device 10, the location must be referenced by its bank address, row address, and column address. In the normal configuration of a 144 Mbit RDRAM device as illustrated in FIG. 3, selecting the bank address of one of the 32 banks requires five address bits, selecting a row address of one of the 512 rows in a bank requires nine address bits, and selecting a column address of one of the 64 columns in a bank requires six address bits. In accordance with the present invention, the 144 Mbit RDRAM device is wafer tested using DQ compression and 2X row compression.

In a further embodiment, a 288 Mbit RDRAM device can be tested according to the invention as well. In the normal configuration of a 288 Mbit RDRAM device, the RDRAM core block 18 is internally configured as 32 banks 22. Each bank 22 is organized as 512 rows 28 by 128 columns 30 by 144 bits 32. Selecting the bank address of one of the 32 banks requires five address bits, selecting a row address of one of the 512 rows in a bank requires nine address bits, and selecting a column address of one of the 128 columns in a bank requires seven address bits. In accordance with the present invention, the 288 Mbit RDRAM device can be wafer tested using either DQ compression or DQ compression and 2X row compression.

Figure 10:
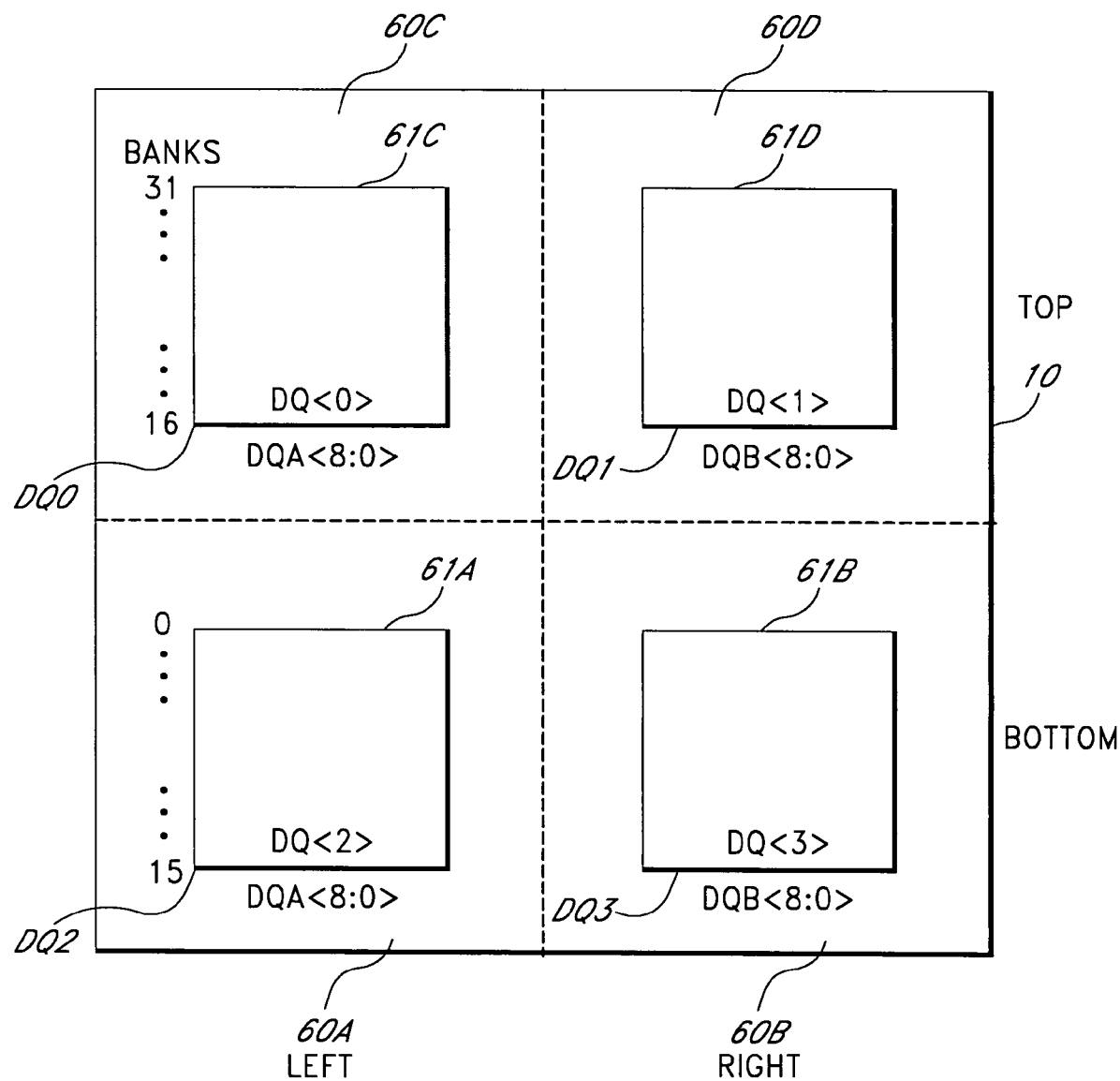
FIG. 10 is a block diagram illustrating the RDRAM core divided up into four quadrants with a single DQ output after DQ compression.

In DQ compression, the RDRAM device 10 is divided into four quadrants, 60A, 60B, 60C, and 60D, as illustrated in FIG. 10, with each quadrant corresponding to a respective 36 megabit array core 61A, 61B, 61C, and 61D. Each array core 61A, 61B, 61C, and 61D is an independent repair region. The lower two quadrants, 60A and 60B, comprise banks 0–15. The upper two quadrants, 60C and 60D, comprise banks 16–31. This division is based on physical design parameters of the RDRAM device 10. The lower left quadrant 60A comprises bits 9–17 of banks 0–15. The lower right quadrant 60B comprises bits 0–8 of banks 0–15. The upper left quadrant 60C comprises bits 9–17 of banks 16–31. The upper right quadrant 60D comprises bits 0–8 of banks 16–31. As discussed below, for testing, only a single bit of data is transferred into and out of each quadrant 60A, 60B, 60C, and 60D. In particular, as will be discussed below, a data bit DQ0 is used to test the upper left quadrant 60C. A data bit DQ1 is used to test the upper right quadrant 60D. A data bit DQ2 is used to test the lower left quadrant 60A. A data bit DQ3 is used to test the lower right quadrant 60B. Therefore, only four data bits are required to test the entire memory. Note further that the upper banks (16–31) and the lower banks (0–15) have separate data connections in the DFT mode. Thus, the most significant bank bit that distinguishes the upper and lower sets of banks is not required, and the number of bank bits is reduced from five bits to four bits.

In one embodiment of the invention using DQ compression and 2X row compression, the 2X row compression further reduces the number of bank address bits required. In particular, the data from corresponding rows in two alternating banks (e.g., bank n with bank n+2 and bank n+16 with bank n+18) are combined as shown in FIGS. 9A and 9B so that the data are transferred to and from both rows using a common DQ bit. This reduces the number of selectable banks in each quadrant from sixteen to eight. Thus, only three bank bits are required to select one of the eight banks in each quadrant.

The data from the two rows of the alternating banks are transferred (either written to the memory or read from the memory) one byte at a time, as in the normal mode. However, because only one data pin is available for each quadrant 60A, 60B, 60C, and 60D, the nine bits of data from each of the two rows (18 bits of data in all) in each quadrant are combined into a respective single bit (i.e., DQ0, DQ1, DQ2, or DQ3). Thus, for each quadrant the data from a column in the two rows are output as a sequence of eight single data bits.

The compression of the data bits is performed by the data compression/expansion logic 59. Each quadrant 60A, 60B, 60C, and 60D can have an associated data compression/expansion logic 59A, 59B, 59C, and 59D as illustrated in FIGS. 9A and 9B. Data are written to the memory by applying a data bit to each of the compressed data pins (i.e., to DQ0, DQ1, DQ2, DQ3). On each clock edge the data compression/expansion logic 59 fans out the single data bit to the eighteen data locations addressed by the bank, row and column bits. Thus, the same data are written into all eighteen locations. Thereafter, when the memory locations are read to test the integrity of the memory, the data from the eighteen locations read during each clock edge are compared to determine if any location has a different data output. If the data are the same, the output on the DQ line has a first constant state (e.g., a logic one or a logic zero in accordance with the data written during the write operation) to indicate pass. If any bit in any of the eighteen locations is different, the data output on the DQ line is forced to have a transition to indicate a failure.

In one embodiment for testing a 288 Mbit RDRAM device, the result of the DQ compression and the 2X row compression is that the array cores 61A, 61B, 61C and 61D are configured as 8 banks by 512 rows by 128 columns by eight four-bit bytes. Therefore, only three bank select bits, nine row address bits, and seven column address bits are required to identify a particular location in the array core. This results in the ability to test each RDRAM device 10 using only nine pins on the wafer probe 50 for defining a specific address location. When the row is activated, nine row address bits identify one of the 512 rows. When a column in an open bank is read, the seven column bits identify the column in the bank to be written to or read from.

Figure 11:
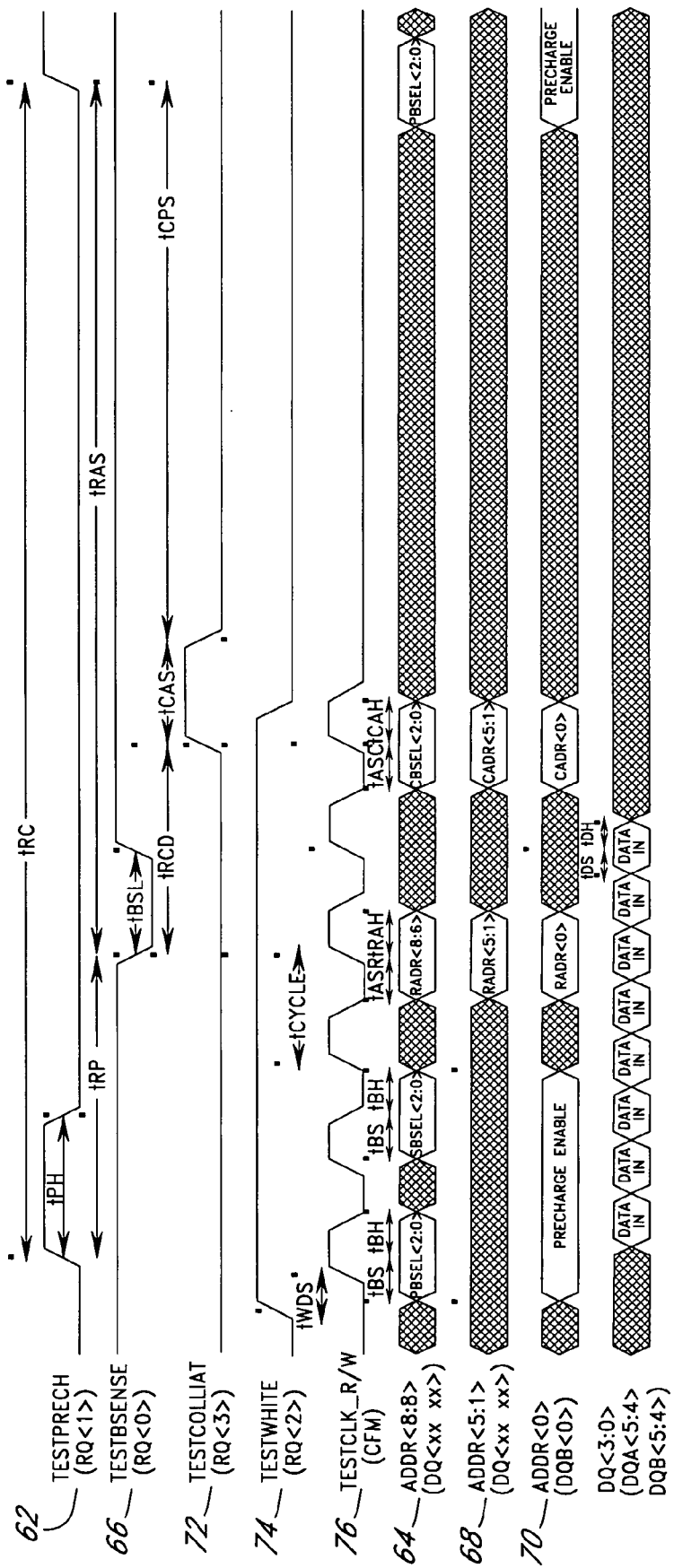
FIG. 11 is a timing diagram illustrating a typical write cycle in the DFT mode.
Figure 12:
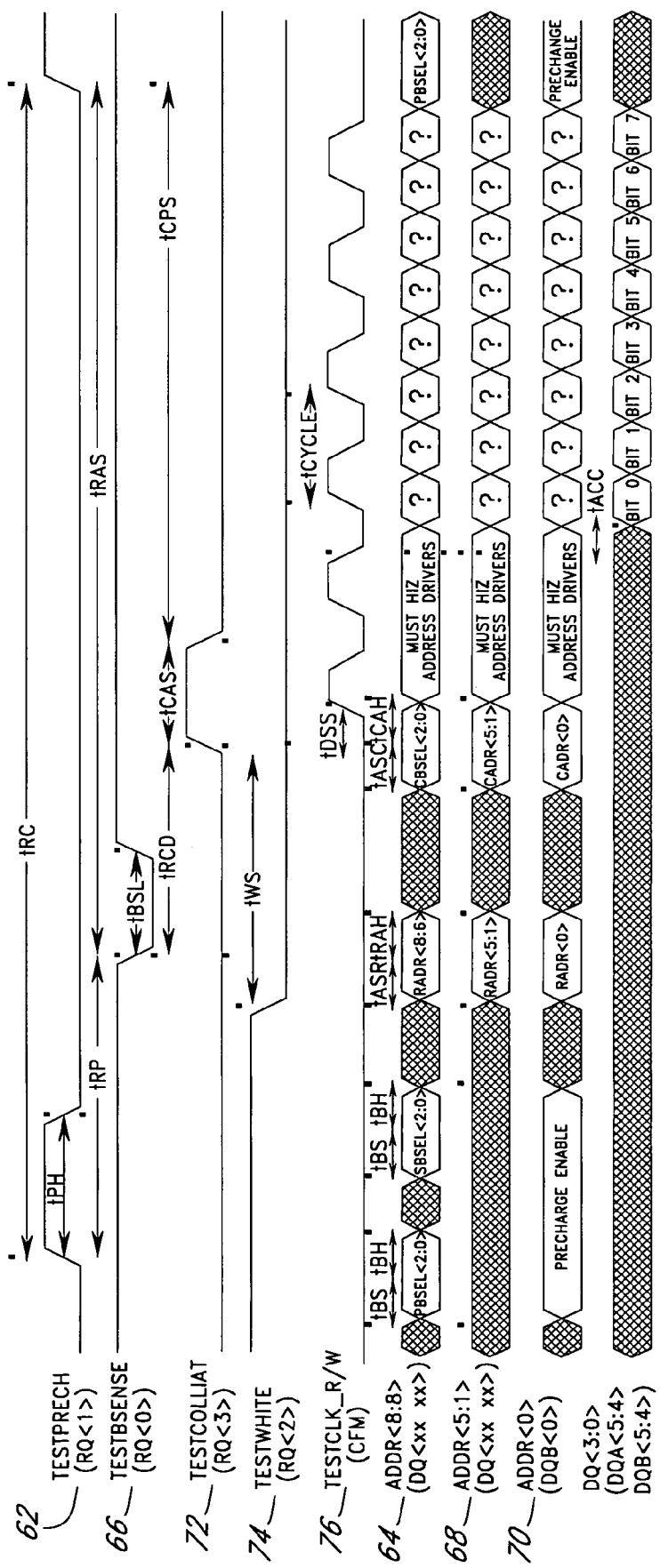
FIG. 12 is a timing diagram illustrating a typical read cycle in the DFT mode.

FIG. 11 is a timing diagram that illustrates a typical write cycle that is used to select the bank for row access and the bank for column access, row address, column address, and strobe in the data. FIG. 12 is a timing diagram that similarly illustrates a typical read cycle. In FIGS. 11 and 12, address pins 64, 68, and 70 refer to subdivisions of the nine address pins used to identify a particular location in the array core. Address pins 64 represent Addr<8:6> (three address pins 8, 7, and 6). Address pins 68 represent Addr<5:1> (five address pins 5, 4, 3, 2, and 1). Address pins 70 represent Addr<0> (one address pin 0).

In the write and read cycles depicted in FIGS. 11 and 12, respectively, a precharge clock, TestPRECH 62, is used to select the bank address. The leading edge of TestPRECH 62 is used to precharge the bank designated by the bank address present on the address pins 64. Precharging the bank prepares the bank and the sense amps for activation. Since adjacent inner banks share the same sense amps, adjacent banks cannot be activated at the same time. Precharging any bank automatically causes adjacent banks to be precharged also, thereby ensuring that adjacent banks are not open at the same time. This happens in all modes of operation, not just the DFT mode.

On the falling edge of TestPRECH 62, the bank corresponding to the bank address on the address pins 64 is latched. This latched bank address represents the bank that will be activated the next time TestBSENSE is presented. Multiple banks can be active at any one time. That is, banks previously activated and not subsequently deactivated by precharging remain active in addition to the newly activated bank. Precharging banks and latching banks are accomplished using different edges of the same TestPRECH signal 62. Thus, the present invention eliminates the need to provide separate control signals for the precharge function and the latching function.

Next, a row address is selected using address pins and a row sense clock, TestBSENSE 66. TestBSENSE 66 causes the selected row of the latched (i.e., active) bank to be sensed. The row address to be sensed is the address present on the address pins 64, 68 and 70 at the falling edge of TestBSENSE 66. Because there are 512 rows, nine address pins are required to select the row to be tested. Because the bank was latched using the other edge of the TestPRECH 62, it is not required to select a bank in this operation. Thus, unlike other known methods, the bank select bits do not have to be applied at this time and only the nine address bits need to be applied.

Data are then either read from or written to the column in accordance with the address present on the address pins at the rising edge of a column latch clock, TestCOLLAT 72. The row address of the bank to be opened is presented on the falling edge of TestBSENSE 66. The address of the column to be accessed is presented on the rising edge of TestCOL-LAT 72. In one embodiment of the invention, if a new bank is to be opened, then the address of that bank must be the same as the bank of the column to be accessed. As a result, nine address bits are sufficient to provide the necessary address bits to identify any location in the array core.

In a further embodiment, the bank must be one of the banks that was active when TestBSENSE 66 was applied. A TestWrite clock 74 determines whether the operation performed at TestCOLLAT 72 time is a read or a write function. If TestWrite=1 at the rising edge of TestCOLLAT 72, then the data present in a write buffer are written to the RDRAM core. If TestWrite=0 at the rising edge of TestCOLLAT 72, then the data are read from the RDRAM core to a read buffer.

FIGS. 11 and 12 show a TestClkR/W clock 76 strobing data into the write buffer or out of the read buffer depending on the state of TestWrite 74. If TestWrite=1, then data are input into the write buffer from the tester on sequential edges of TestClkR/W 76, beginning with the first falling edge. Eight clock edges transfer data. It takes a total of six TesClkR/W 76 cycles to completely load the write buffer. Additional clock cycles will initiate another load sequence. A load sequence is not terminated until the exact number of clock cycles are provided. If TestWrite=0, then data are read from the read buffer to the external bus on each edge of TestClkR/W 76, beginning with the second falling edge. Eight clock edges transfer the data. It takes a total of six TestClkR/W 76 cycles to completely empty the read buffer. The chip under test remains in the output mode until all data are read out of the read buffer. Any additional clock cycles initiates a new read sequence. Note that any transition on TestClkR/W 76 initiates a read or write sequence depending on the state of TestWrite 74.

Figure 13:
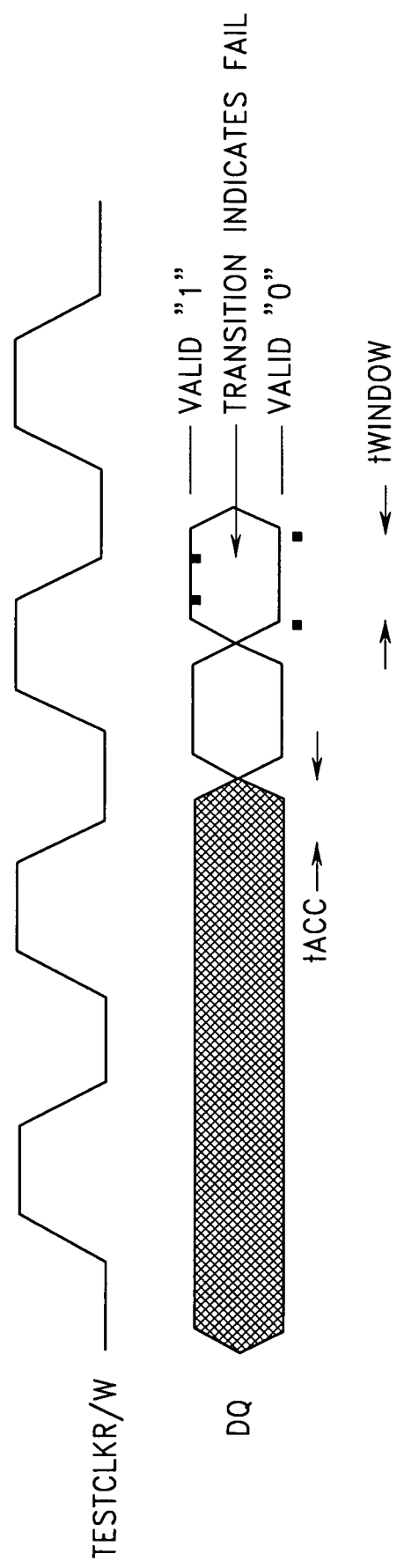
FIG. 13 is a timing diagram illustrating the compressed data output for a DQ in a window manner showing a fault detection.

FIG. 13 is a timing diagram that illustrates the compressed data being output in a window manner when reading the compressed DQs. If the expected data is a "0", then the DQ will be low during the entire window. A failure is indicated if the wrong data is present, or if a data transition is detected during the window. If the expected data is "1", then the DQ should remain high throughout the window.

If a fault is indicated, it is not necessary to determine which bit failed, it is sufficient to localize the fault to a row. The tester has the capability to reconfigure the chip so that a spare row is used to replace the row with the fault. The technology for such reconfiguration is well known in the field.

Note that by reducing the required address bits to three and by using both edges of the TestPRECH control signal, the maximum number of address bits required is nine, which with the addition of the four data bits, totals thirteen. This is significantly fewer than the eighteen data and address bits used in other known test methods.

Although specific implementations and operation of the invention have been described above with reference to specific embodiments, the invention may be embodied in other forms without departing from the spirit or central characteristics of the invention. The described embodiments are to be considered in all respects only as illustrative and not restrictive. The scope of the invention is indicated by the appended claims rather than by the foregoing description. All changes which come within the meaning of equivalency of the claims are to be embraced within their scope.

What is claimed is:

1. A method of testing a memory device, the method comprising:
   precharging a bank of locations of a memory device at a time defined by a first portion of a first control signal;
   latching the bank of locations at a time defined by a second portion of the first control signal;
   selecting a row address in the bank of locations at a time defined by a first portion of a second control signal;
   selecting a column address at a time defined by first portion of a third control signal;
   outputting data stored at a location of the memory device defined by the selected row address and the selected column address.

2. The method of claim 1, wherein the first portion of the first control signal is leading edge of the first control signal.

3. The method of claim 2, wherein the second portion of the first control signal is a trailing edge of the first control signal.

4. The method of claim 1, wherein the bank of locations is divided into a plurality of array cores, wherein each array core comprises and independent repair region.

5. The method of claim 1, wherein th memory device comprises a Rambus dynamic random access memory (RDRAM).

6. The method of claim 1, additionally comprising receiving at most four address bits that identify th bank of locations to be precharged.

7. The method of claim 1, additionally comprising receiving at most three address bits that identify the bank of locations to be precharged.

8. The method of claim 1, wherein the act of selecting the row address comprises receiving nine address bits.

9. The method of claim 1, wherein the act of selecting the column address comprises receiving six address bits.

10. The method of claim 1, wherein the act of selecting the column address comprises receiving seven address bits.

11. A method of testing a memory device, the method comprising:
precharging a bank of locations of a memory device at a time defined by a first portion of a control signal;
latching the bank of locations at a time defined by a second portion of the control signal;
selecting a row address in the bank of locations;
selecting a column address in the bank of locations;
outputting data stored at a location of the memory device defined by the selected row address and the selected column address.

12. The method of claim 11, wherein the first portion of the control signal is a leading edge of the control signal.

13. The method of claim 12, wherein the second portion of the control signal is a trailing edge of the control signal.

14. The method of claim 11, wherein the bank of locations is divided into a plurality of array cores, wherein each array core comprises an independent repair region.

15. The method of claim 11, wherein the memory device comprises a Rambus dynamic random access memory (RDRAM).

16. The method of claim 11, additionally comprising receiving at most four address bits that identify the bank of locations to be precharged.

17. The method of claim 11, additionally comprising receiving at most three address bits that identify the bank of locations to be precharged.

18. The method of claim 11, wherein the act of selecting the row address comprises receiving nine address bits.

19. The method of claim 11, wherein the act of selecting the column address comprises receiving six address bits.

20. The method of claim 11, wherein the act of selecting the column address comprising receiving seven address bits.

21. A memory device comprising:
a plurality of banks; and
control logic configured to receive from a testing device a first control signal having a precharge signal defined by a first portion of the first control signal and a latch signal defined by a second portion of the first control signal,
and wherein the control logic is further configured to receive a bank address that identifies at least one bank, of the plurality of banks, to be precharged, and wherein the control logic is configured to receive a row address in the at least one precharged bank at a time defined by a second control signal and a column address in the at least one precharged bank at a time defined by a third control signal.

22. The memory device of claim 21, wherein the first portion of the first control signal is a leading edge of the first control signal.

23. The memory device of claim 22, wherein the second portion of the first control signal is a trailing edge of the first control signal.

24. The memory device of claim 21, wherein the control logic is configured to operate in a design for test (DFT) mode.

25. The memory device of claim 21, further comprising data compression logic configured to receive test data from the testing device.

26. The memory device of claim 25, wherein the bank address identifies multiple banks, of the plurality of banks, to be precharged.

27. The memory device of claim 26, wherein the row address and the column address identify locations in the multiple precharged banks.

28. The memory device of claim 27, wherein the data compression logic is configured to output the same test data to each location in the multiple precharged banks.

29. The memory device of claim 21, further comprising a plurality of bonding pads configured to receive the first, second and third control signals from the testing device.

30. The memory device of claim 29, wherein the control logic is configured to receive the first control signal through a single bonding pad.

31. A method of preparing computer memory device location to be tested, the method comprising:
precharging a bank of locations of a computer memory device at a time defined by a first portion of a control signal; and
latching the bank of locations at a time defined by a second portion of the control signal.

32. The method of claim 31, wherein the first portion of the control signal is a leading edge of the control signal.

33. The method of claim 32, wherein the second portion of the control signal is a trailing edge of the control signal.

34. The method of claim 31, wherein the bank of locations is divided into a plurality of array cores, wherein each array core comprises an independent repair region.

35. The method of claim 31, wherein the computer memory device comprises a Rambus dynamic random access memory (RDRAM).

36. A memory device comprising:
a plurality of array cores, each array core comprising a plurality of banks; and
control logic configured to receive a control signal having a precharge signal defined by a first portion of the control signal and a latch signal defined by a second portion of the control signal, and wherein the control logic is further configured to receive a bank address that identifies at least one bank, of the plurality of banks, to be precharged.

37. The memory device of claim 36, wherein the first portion of the control signal is a leading edge of the control signal.

38. The memory device of claim 36, wherein the second portion of the control signal is a trailing edge of the control signal.

39. The memory device of claim 36, wherein the control logic is configured to operate in a design for test (DFT) mode.

40. The memory device of claim 36, further comprising data compression logic configured to receive test data from the testing device.

41. The memory device of claim 40, wherein the bank address identifies multiple banks, of the plurality of banks, to be precharged.

42. The memory device of claim 41, wherein the data compression logic is configured to output the same test data to locations in the multiple precharged banks.

43. The memory device of claim 36, further comprising a plurality of bonding pads.

44. The memory device of claim 43, wherein the control logic is configured to receive the control signal through a single bonding pad.

45. A memory device comprising:
a plurality of array cores, each array core comprising a plurality of banks; and
means for receiving a control signal having a precharge signal defined by a first portion of the control signal and a latch signal defined by a second portion of the control signal, and wherein the means for receiving is further configured to receive a bank address that identifies at least one bank, of the plurality of banks, to be precharged.

46. The memory device of claim 45, wherein the first portion of the control signal is a leading edge of the control signal.

47. The memory device of claim 45, wherein the second portion of the control signal is a trailing edge of the control signal.

48. The memory device of claim 45, wherein the means for receiving is configured to operate in a design for test (DFT) mode.

* * * * *